US008828505B2

(12) United States Patent
Thridandam et al.

(10) Patent No.: US 8,828,505 B2
(45) Date of Patent: Sep. 9, 2014

(54) PLASMA ENHANCED CYCLIC CHEMICAL VAPOR DEPOSITION OF SILICON-CONTAINING FILMS

(75) Inventors: Hareesh Thridandam, Carlsbad, CA (US); Manchao Xiao, San Diego, CA (US); Xinjian Lei, Vista, CA (US); Thomas Richard Gaffney, Carlsbad, CA (US); Eugene Joseph Karwacki, Jr., Orefield, PA (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/405,453

(22) Filed: Feb. 27, 2012

(65) Prior Publication Data

US 2012/0171874 A1    Jul. 5, 2012

Related U.S. Application Data

(62) Division of application No. 12/030,186, filed on Feb. 12, 2008, now abandoned.

(51) Int. Cl.
*C23C 16/00* (2006.01)
*H01L 21/31* (2006.01)

(52) U.S. Cl.
USPC .................. 427/579; 427/569; 427/248.1

(58) Field of Classification Search
None
See application file for complete search history.

(56) References Cited

U.S. PATENT DOCUMENTS

| 4,720,395 A | 1/1988 | Foster |
| 5,234,869 A | 8/1993 | Mikata et al. |
| 5,976,991 A | 11/1999 | Laxman et al. |
| 6,391,803 B1 | 5/2002 | Kim et al. |
| 6,881,636 B2 | 4/2005 | Weimer et al. |
| 6,963,101 B2 | 11/2005 | Weimer et al. |
| 7,129,187 B2 | 10/2006 | Joe |
| 7,166,516 B2 | 1/2007 | Furuhashi et al. |
| 2001/0000476 A1 | 4/2001 | Xia et al. |
| 2002/0175393 A1 | 11/2002 | Baum et al. |
| 2003/0020111 A1 | 1/2003 | Bevan |
| 2003/0026083 A1 | 2/2003 | Duban-Hu et al. |
| 2003/0036097 A1 | 2/2003 | Alam |
| 2003/0059535 A1 | 3/2003 | Luo et al. |

(Continued)

FOREIGN PATENT DOCUMENTS

| JP | 6-132284 | 5/1994 |
| JP | 2003-007700 A | 1/2003 |

(Continued)

OTHER PUBLICATIONS

Air products website screen shot—search for Bis tert butyl aminosilane Dec. 11, 2013.*

(Continued)

*Primary Examiner* — Joseph Miller, Jr.
(74) *Attorney, Agent, or Firm* — Rosaleen P. Morris-Oskanian; Lina Yang

(57) ABSTRACT

The present invention is a process of plasma enhanced cyclic chemical vapor deposition of silicon nitride, silicon carbonitride, silicon oxynitride, silicon carboxynitride, and carbon doped silicon oxide from alkylaminosilanes having Si—$H_3$, preferably of the formula $(R^1R^2N)SiH_3$ wherein $R^1$ and $R^2$ are selected independently from $C_2$ to $C_{10}$ and a nitrogen or oxygen source, preferably ammonia or oxygen has been developed to provide films with improved properties such as etching rate, hydrogen concentrations, and stress as compared to films from thermal chemical vapor deposition.

6 Claims, 4 Drawing Sheets

(56) References Cited

U.S. PATENT DOCUMENTS

| | | | |
|---|---|---|---|
| 2004/0017383 | A1 | 1/2004 | Baer et al. |
| 2004/0044958 | A1 | 3/2004 | Wolf et al. |
| 2005/0048204 | A1 | 3/2005 | Dussarrat et al. |
| 2005/0129862 | A1 | 6/2005 | Nagaraj et al. |
| 2005/0152501 | A1 | 7/2005 | Sukovic et al. |
| 2005/0159017 | A1 | 7/2005 | Kim et al. |
| 2005/0255714 | A1 | 11/2005 | Iyer et al. |
| 2006/0019032 | A1 | 1/2006 | Wang et al. |
| 2006/0045986 | A1 | 3/2006 | Hochberg et al. |
| 2006/0087893 | A1 | 4/2006 | Nishihara et al. |
| 2006/0258173 | A1 | 11/2006 | Xiao et al. |
| 2008/0081470 | A1 | 4/2008 | Clark |

FOREIGN PATENT DOCUMENTS

| | | |
|---|---|---|
| JP | 2006301338 | 11/2006 |
| WO | 2005/080628 | 10/2005 |
| WO | 2006/033699 A2 | 3/2006 |

OTHER PUBLICATIONS

Air products website screen shot—search for DI tert butyl aminosilane Dec. 11, 2013.*

BTBAS—datasheet from Air Products website—downloaded Dec. 11, 2013.*

Schmidbaur, H.; "Zeitschrift fuer Naturgorschung"; B: Chemical Sciences; 1990; vol. 45, No. 12; pp. 1679-1683.

John Gumpher et al, Characterization of Low-Temperature Silicon Nitride LPCVD from Bis(tertiary-butylamino) silane and Ammonia, J. The Elec. Soc., 151 (5) 2004, pp. G353-G359.

Anatoli A. Korkin et al, On The Mechanism of Silicon Nitride Chemical Vapor Deposition From Dichlorosilane and Ammonia, J. The Elec. Soc. 146 (11), 1999, pp. 4203-4212.

Alexander A. Bagatur'yants et al, Silicon Nitride Chemical Vapor Deposition From Dichlorosilane and Ammonia: Theoretical Study of Surface Structures and Reaction Mechanism, Surface Science 486 2001 pp. 213-225.

B.J. Aylett et al, The Preparation and Properties of Dimethylamino- and Diethylannino-silane, J. Chem. Soc. (A), 1967, pp. 652-655.

Richard S. Larson, et al Kinetics of Silicon Nitride Chemical Vapor Deposition From Silicon Tetrafluoride and Ammonia, J. Am. Ceram. Soc. 76(8) (1993) pp. 1930-1936.

M. Leskela, et al, Atomic Layer Deposition Chemistry: Recent Developments and Future Challenges, Agnew. Chem. Int. Ed., 2003; vol. 42, 5548-5554.

* cited by examiner

PLASMA ENHANCED CYCLIC CHEMICAL VAPOR DEPOSITION OF SILICON-CONTAINING FILMS

CROSS REFERENCE TO RELATED APPLICATIONS

The present patent application is a divisional application of U.S. patent application Ser. No. 12/030,186, filed Feb. 12, 2008.

BACKGROUND OF THE INVENTION

The electronic device manufacturing industry has used chemical vapor deposition (CVD), cyclic chemical vapor deposition (CCVD), or atomic layer deposition (ALD) of silicon nitride, silicon carbonitride, and silicon oxynitride in making integrated circuits. Examples of this industry use include: US 2003/0020111; US 2005/0048204 A1; U.S. Pat. Nos. 4,720,395; 7,166,516; Gumpher, J., W. Bather, N. Mehta and D. Wedel. "Characterization of Low-Temperature Silicon Nitride LPCVD from Bis(tertiary-butylamino)silane and Ammonia." Journal of The Electrochemical Society 151(5): (2004) G353-G359; US 2006/0045986; US 2005/152501; US 2005/255714; U.S. Pat. No. 7,129,187; U.S 2005/159017; U.S. Pat. Nos. 6,391,803; 5,976,991; US 2003/0059535; U.S. Pat. No. 5,234,869; JP2006-301338; US 2006/087893; US 2003/26083; US 2004/017383; U.S. 2006/0019032; US 2003/36097; US 2004/044958; U.S. Pat. Nos. 6,881,636; 6,963,101; US 2001/0000476; and US2005/129862. The present invention offers an improvement over this prior industry practice for CVD or ALD of silicon-containing films such as silicon nitride, silicon carbonitride, silicon oxynitride, and silicon carbon oxide, and carbon doped silicon oxide on a substrate, as set forth below.

BRIEF SUMMARY OF THE INVENTION

The present invention is a process to deposit silicon-containing films such as silicon nitride, silicon carbonitride, silicon oxynitride, and carbon doped silicon oxide on a substrate.

One embodiment of the present invention is a process to deposit silicon nitride, silicon carbonitride, silicon oxynitride, and silicon carboxynitride on a semi-conductor substrate comprising:
  a. contacting a nitrogen-containing source with a heated substrate under remote plasma conditions to absorb at least a portion of the nitrogen-containing source on the heated substrate,
  b. purging away any unabsorbed nitrogen-containing source,
  c. contacting the heated substrate with a silicon-containing source having one or more Si—$H_3$ fragments to react with the absorbed nitrogen-containing source, wherein the silicon-containing source has one or more $H_3Si$—$NR^0{}_2$ ($R^0$=$SiH_3$, R, $R^1$ or $R^2$, defined below) groups selected from the group consisting of one or more of:

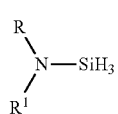

A

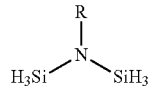

B

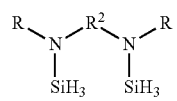

C wherein R and $R^1$ in the formulas represent aliphatic groups having from 2 to 10 carbon atoms, wherein R and $R^1$ in formula A may also be a cyclic group, and $R^2$ selected from the group consisting of a single bond, $(CH_2)_n$, a ring, or $SiH_2$, and
  d. purging away the unreacted silicon-containing source.

Another embodiment of the present invention is a process to deposit silicon oxynitride, silicon carboxynitride, and carbon doped silicon oxide on a substrate comprising:
  a. contacting a oxygen-containing source with a heated substrate under remote plasma conditions to absorb at least a portion of the oxygen-containing source on the heated substrate,
  b. purging away any unabsorbed oxygen-containing source,
  c. contacting the heated substrate with a silicon-containing source having one or more Si—$H_3$ fragments to react with the absorbed nitrogen-containing source, wherein the silicon-containing source has one or more $H_3Si$—$NR^0{}_2$ ($R^0$=$SiH_3$, R, $R^1$ or $R^2$, defined below) groups selected from the group consisting of one or more of:

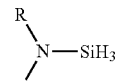

A

B

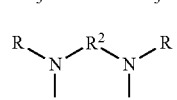

C wherein R and $R^1$ in the formulas represent aliphatic groups having from 2 to 10 carbon atoms, wherein R and $R^1$ in formula A may also be a cyclic group, and $R^2$ selected from the group consisting of a single bond, $(CH_2)_n$, a ring, or $SiH_2$, and
  d. purging away the unreacted silicon-containing source.

DETAILED DESCRIPTION OF THE INVENTION

The present invention is a process of plasma enhanced cyclic chemical vapor deposition of silicon nitride, silicon carbonitride, silicon oxynitride, silicon carboxynitride, and carbon doped silicon oxide from alkylaminosilanes having Si—H$_3$, preferably of the formula (R$^1$R$^2$N)SiH$_3$ wherein R$^1$ and R$^2$ are selected independently from C$_2$ to C$_{10}$ and a nitrogen source, preferably ammonia has been developed to provide films with improved properties such as etching rate, hydrogen concentrations, and stress as compared to films from thermal chemical vapor deposition. Alternately, the process can be performed as atomic layer deposition (ALD), plasma assisted atomic layer deposition (PAALD), chemical vapor deposition (CVD), low pressure chemical vapor deposition (LPCVD), plasma enhanced chemical vapor deposition (PECVD) or spin on deposition (SOD).

Figure 1:
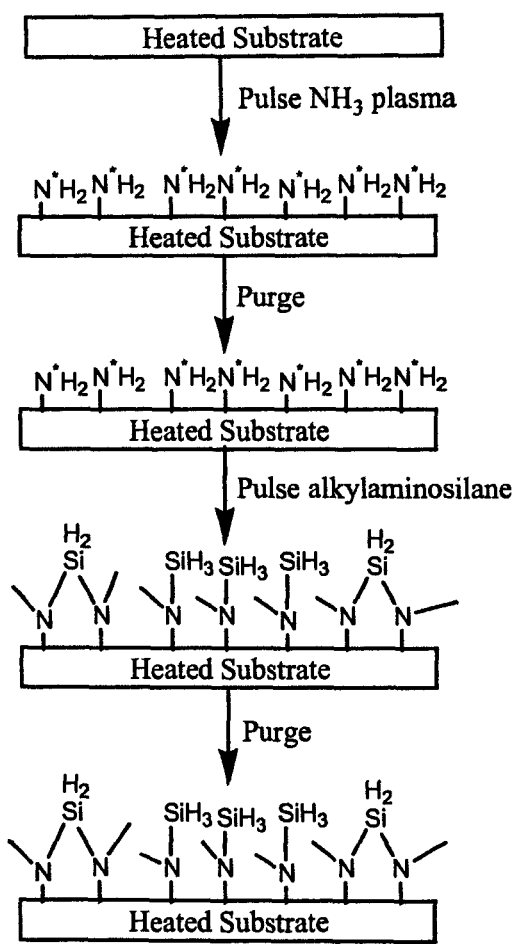
FIG. 1 is a scheme of typical plasma enhanced cyclic chemical vapor deposition for silicon nitride, silicon carbonitride, silicon oxynitride, and silicon carboxynitride.

A typical cycle of plasma enhanced cyclic chemical vapor deposition is given FIG. 1.

The remote plasma chamber is a Litmas RPS manufactured by Advanced Energy Industries, Inc. The Litmas RPS is a cylindrical inductive plasma source (quartz chamber) integrated with a solid-state RF power delivery system. Water cooled coils are wrapped around the chamber to provide cooling for the chamber and to form the RF antenna. The frequency operating range is between 1.9 MHz and 3.2 MHz. The DC output power range is 100 W to 1500 W.

The ALD system is a Savannah 100 manufactured by Cambridge NanoTech, Inc. The ALD reactor is anodized aluminum and accommodates a 100 mm silicon substrate. The ALD reactor has an embedded disk-shaped heating element which heats the substrate from the bottom. There is also a tubular heater embedded in the reactor wall. The precursor valve manifold is enclosed within a heating block, and heating jackets are used to heat the precursor vessels. The ALD valves in the precursor valve manifold are three-way valves, which continuously supply 10-100 sccm of inert gas to the ALD reactor.

The deposition process for silicon nitride, silicon carbonitride, silicon oxynitride, and silicon carboxynitride is described in the following.

In the first step of the process, ammonia plasma is generated in a remote plasma chamber installed approximately 12 inches upstream of the deposition chamber and is supplied to the deposition chamber at a predetermined volume flow rate and for a predetermined time. Typically, the ammonia plasma is supplied to the ALD chamber by opening the gate valve between the remote plasma head and the ALD reactor for a period of 0.1 to 80 seconds to allow the ammonia radicals to be sufficiently adsorbed so as to saturate a substrate surface. During deposition, the ammonia flow rate supplied to the inlet of the remote plasma chamber is typically in the range of 1 to 100 sccm. The RF power in the plasma chamber is variable between 100 W and 1500 W. Deposition temperatures are conventional and range from about 200 to 600° C., preferably from 200 to 400° C. for atomic layer deposition and 400 to 600° C. for cyclic chemical vapor deposition. Pressures of from 50 mtorr to 100 torr are exemplary. In addition, to ammonia, other nitrogen-containing source can be nitrogen, hydrazine, monoalkylhydrozine, dialkylhydrozine, and mixture thereof.

In the second step of the process, an inert gas, such as Ar, N$_2$, or He, is used to sweep unreacted ammonia radicals from the chamber. Typically in a cyclic deposition process, a gas, such as Ar, N$_2$, or He, is supplied into the chamber at a flow rate of 10 to 100 sccm, thereby purging the ammonia radicals and any byproducts that remain in the chamber.

In the third step of the process, an organoaminosilane, such as diethylaminosilane (DEAS), di-iso-propylaminosilane (DIPAS), di-tert-butylaminosilane (DTBAS), di-sec-butylaminosilane, di-tert-pentylamino silane and mixtures thereof, is introduced into the chamber at a predetermined molar volume. e.g., from 1 to 100 micromoles for a predetermined time period, preferably about 0.005 to 10 seconds. The silicon precursor reacts with the ammonia radicals adsorbed on the surface of the substrate resulting in the formation of silicon nitride. Conventional deposition temperatures of from 200 to 500° C. and pressures of from 50 mtorr to 100 torr are employed.

In the fourth step of the process, an inert gas, such as Ar, N$_2$, or He, is used to sweep unreacted organoaminosilane from the chamber. Typically in a cyclic deposition process, a gas, such as Ar, N$_2$, or He, is supplied into the chamber at a flow rate of 10 to 100 sccm, thereby purging the organoaminosilane and any byproducts that remain in the chamber.

The four process steps described above comprise a typical ALD process cycle. This ALD process cycle is repeated several times until the desired film thickness is obtained.

Figure 2:
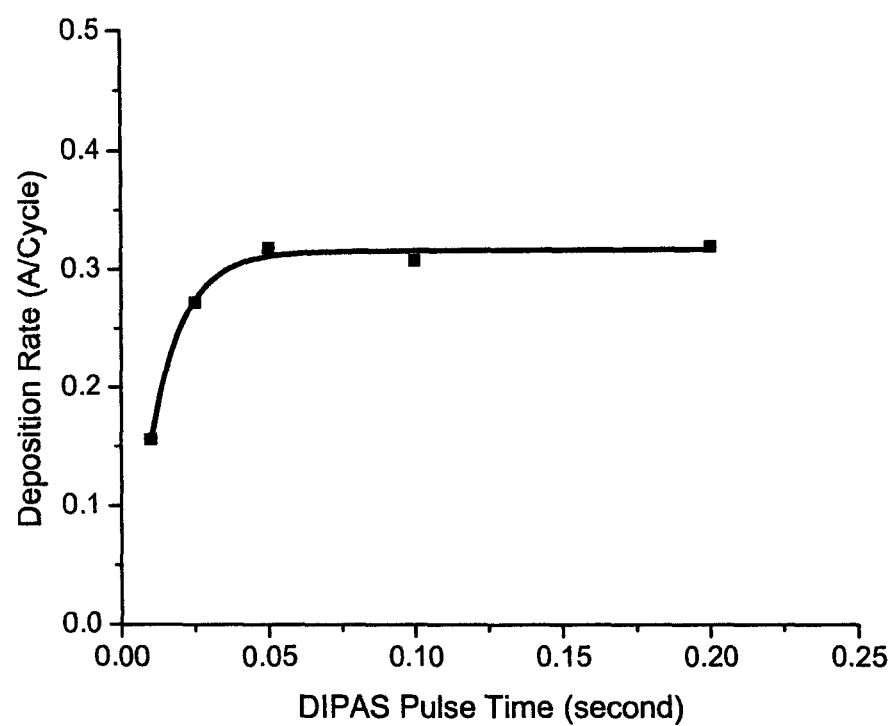
FIG. 2 is a Deposition Rate vs Pulse Time graph for DIPAS with the following PEALD experimental conditions: 5 sccm $NH_3$ with plasma power of 1.39 kW, 10 sccm $N_2$ as sweeping gas, substrate temperature of 400° C., DIPAS at 40° C. in a stainless steel container.

FIG. 2. exhibits a typical ALD saturation curve at a substrate temperature of 400° C.

Figure 3:
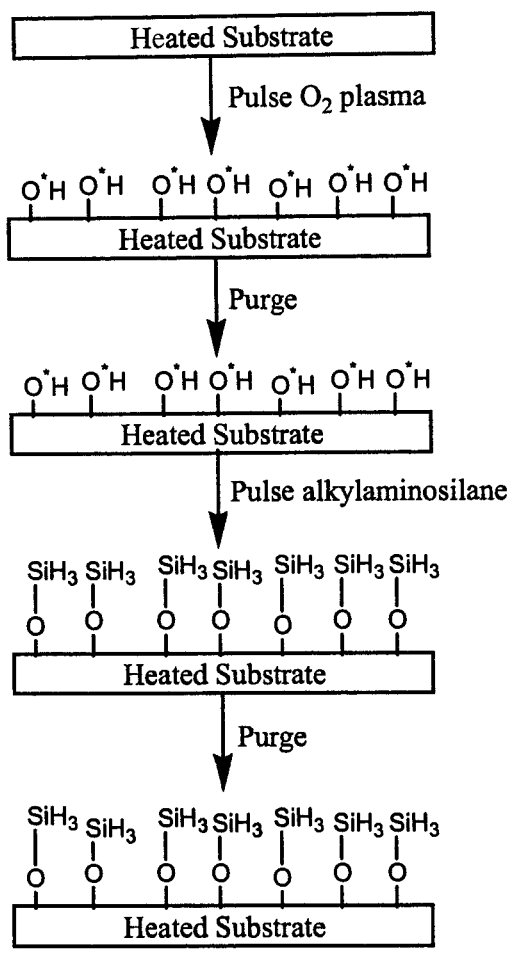
FIG. 3 is a scheme of typical plasma enhanced cyclic chemical vapor deposition for silicon oxynitride and carbon doped silicon oxide.

A typical cycle of plasma enhanced cyclic chemical vapor deposition for silicon oxynitride and carbon doped silicon oxide given FIG. 3.

In the first step of the process, oxygen plasma is generated in a remote plasma chamber installed approximately 12 inches upstream of the deposition chamber and is supplied to the deposition chamber at a predetermined volume flow rate and for a predetermined time. Typically, the oxygen plasma is supplied to the ALD chamber by opening the gate valve between the remote plasma head and the ALD reactor for a period of 0.1 to 80 seconds to allow the oxygen containing radicals to be sufficiently adsorbed so as to saturate a substrate surface. During deposition, the oxygen flow rate supplied to the inlet of the remote plasma chamber is typically in the range of 1 to 100 sccm. The RF power in the plasma chamber is variable between 100 W and 1500 W. Deposition temperatures are conventional and range from about 200 to 600° C., preferably from 200 to 400° C. for atomic layer deposition and 400 to 600° C. for cyclic chemical vapor deposition. Pressures of from 50 mtorr to 100 torr are exemplary. In addition to oxygen, other oxygen-containing source can be ozone, nitrous oxide, and mixture thereof.

In the second step of the process, an inert gas, such as Ar, N$_2$, or He, is used to sweep unreacted oxygen containing radicals from the chamber. Typically in a cyclic deposition process, a gas, such as Ar, N$_2$, or He, is supplied into the chamber at a flow rate of 10 to 100 sccm, thereby purging the oxygen containing radicals and any byproducts that remain in the chamber.

In the third step of the process, an organoaminosilane, such as diethylaminosilane (DEAS), di-iso-propylaminosilane (DIPAS), di-tert-butylaminosilane (DTBAS), di-sec-butylaminosilane, di-tert-pentylamino silane and mixtures thereof, is introduced into the chamber at a predetermined molar volume. e.g., from 1 to 100 micromoles for a predetermined time period, preferably about 0.005 to 10 seconds. The silicon precursor reacts with the oxygen containing radicals adsorbed on the surface of the substrate resulting in the formation of silicon nitride. Conventional deposition temperatures of from 200 to 500° C. and pressures of from 50 mtorr to 100 torr are employed.

In the fourth step of the process, an inert gas, such as Ar, $N_2$, or He, is used to sweep unreacted organoaminosilane from the chamber. Typically in a cyclic deposition process, a gas, such as Ar, $N_2$, or He, is supplied into the chamber at a flow rate of 10 to 100 sccm, thereby purging the organoaminosilane and any byproducts that remain in the chamber.

The four process steps described above comprise an ALD process cycle. This ALD process cycle is repeated several times until the desired film thickness is obtained.

EXAMPLE 1

In an ALD reactor, the said silicon precursor was introduced along with $NH_3$ after the reactor was pumped down to a vacuum level of ~40 mT and purged with 10 sccm $N_2$. The deposition was performed at a temperature of 400° C. A remote plasma was also used to reduce the required deposition temperature. The said silicon precursor was pre-heated to 40° C. in a bubbler wrapped with a heat jacket before being introduced into the reactor. The results are summarized in Table 1.

Since only very small amount of chemical was used during one deposition, the flow rate (amount per unit time) of the said silicon precursor out of the bubbler can then be considered to be constant at a given temperature. Therefore, the amount of the said silicon precursor added into the ALD reactor is linearly proportional to the pulse time used to introduce the said silicon precursor.

As can be seen from Table 1, the rate of forming silicon nitride films changes as the amount of the said silicon precursor added into the reactor changes even when the deposition temperature and the amount of nitrogen precursor are kept the same.

It can also be seen from Table 1, when other processing conditions are kept the same, the rate of forming silicon nitride films increases initially from 0.156 A/cycle as the pulse time (or amount) of the said silicon precursor increases from 0.01 seconds to 0.05 seconds. Then, however, the rate remains almost unchanged after even more silicon precursor is added. This suggests that the films formed using the Si precursor are indeed ALD films.

TABLE 1

| Temperature (° C.) | $NH_3$ pulse (second) | Silicon precursor pulse time (second) | Deposition Rate (A/cycle) |
|---|---|---|---|
| 400 | 3 | 0.01 | 0.156 |
| 400 | 3 | 0.025 | 0.272 |
| 400 | 3 | 0.05 | 0.318 |
| 400 | 3 | 0.1 | 0.307 |
| 400 | 3 | 0.2 | 0.3 |

EXAMPLE 2

Figure 4:
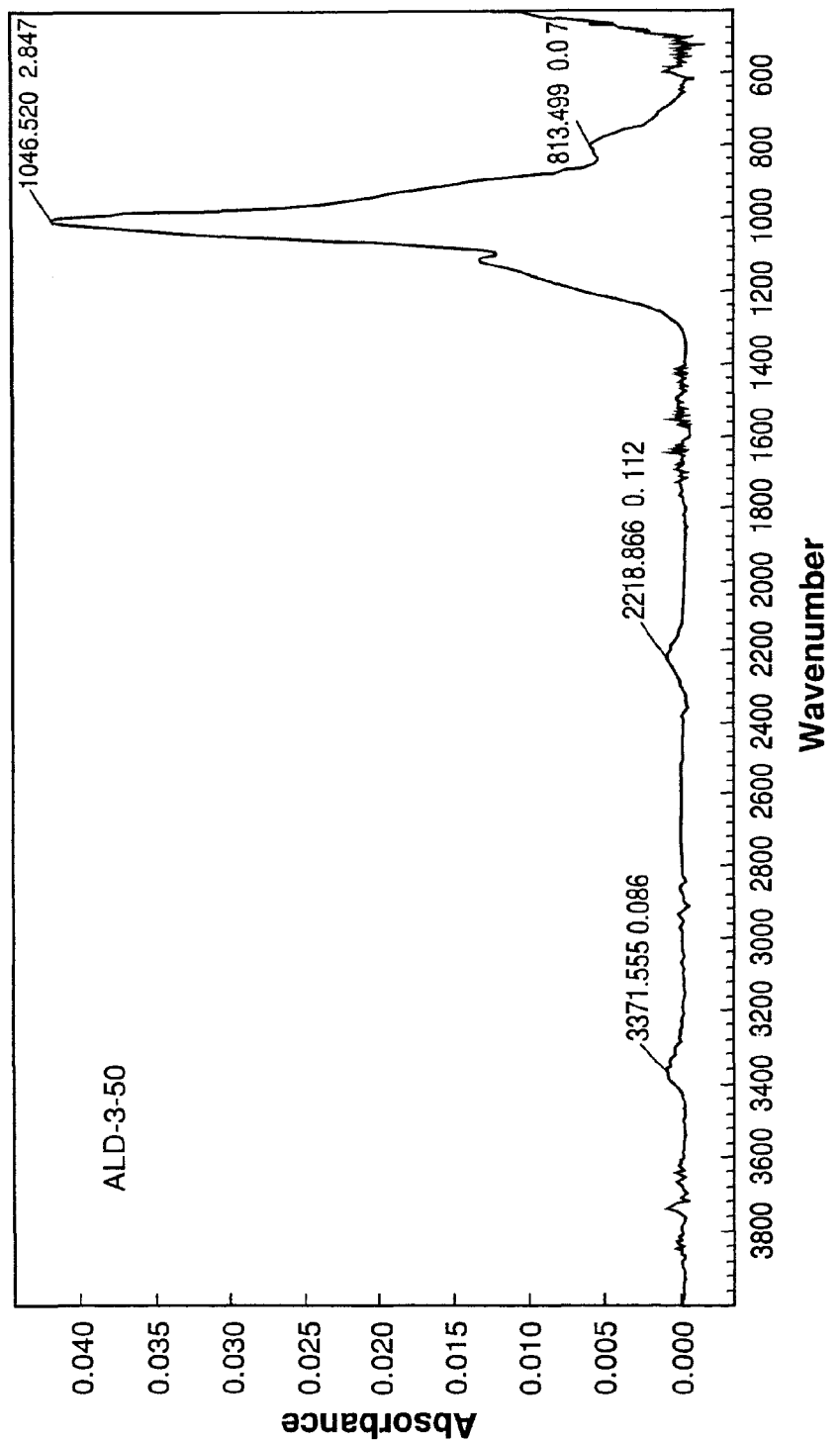
FIG. 4 is the FTIR spectrum for the films of Example 1 and discussed in Example 2.

The deposited ALD films were analyzed using FTIR. The FTIR spectrum for the films is shown in FIG. 4. As can be seen from FIG. 4 there is an absorbance peak at 1046 $cm^{-1}$, suggesting oxide presence in the film. The peak at 3371 is an N—H stretch (with some O—H) and has the corresponding rock at the shoulder near 1130 cm−1. The 2218 peak is from Si—H and its broad shape indicates a low stress film. The 813 peak is near Si—N. An EDX analysis of the deposited films also confirmed the presence of Si and N in the films.

The embodiments of the present invention listed above, including the working examples, are exemplary of numerous embodiments that may be made of the present invention. It is contemplated that numerous other configurations of the process may be used, and the materials used in the process may be selected from numerous materials other than those specifically disclosed. In short, the present invention has been set forth with regard to particular embodiments, but the full scope of the present invention should be ascertained from the claims as follow.

The invention claimed is:

1. A process to deposit silicon oxynitride, silicon carboxynitride, and carbon doped silicon oxide on a semi-conductor substrate comprising:
   a. contacting a heated substrate with an oxygen-containing plasma comprising oxygen-containing radicals to absorb at least a portion of the oxygen-containing radicals on the heated substrate, wherein the oxygen-containing plasma was generated at a location remote relative to the substrate;
   b. purging away any unabsorbed oxygen-containing radicals;
   c. contacting the heated substrate with a silicon-containing source having one or more Si—$H_3$ fragments to react with the absorbed oxygen-containing radicals, wherein the silicon-containing source is selected from the group consisting of di-iso-propylaminosilane (DIPAS), di-tert-butylaminosilane (DTBAS), di-sec-butylaminosilane, di-tert-pentylamino silane and mixtures thereof; and
   d. purging away any unreacted silicon-containing source.

2. The process of claim 1 wherein the process is repeated until a desired thickness of film is established.

3. The process of claim 1 wherein the process is an atomic layer deposition.

4. The process of claim 1 wherein the process is a plasma enhanced cyclic chemical vapor deposition.

5. The process of claim 1 wherein the substrate temperature is in the range of 200 to 600° C.

6. The process of claim 1 wherein the oxygen-containing radicals are generated by subjecting an oxygen-containing gas to plasma energy, wherein the oxygen-containing gas is selected from the group consisting of oxygen, nitrous oxide, ozone, and mixture thereof.

* * * * *